United States Patent [19]
Lee

[11] Patent Number: 6,071,763
[45] Date of Patent: Jun. 6, 2000

[54] METHOD OF FABRICATING LAYERED INTEGRATED CIRCUIT

[75] Inventor: Jia-Sheng Lee, Hsinchu, Taiwan

[73] Assignee: United Microelectronics Corp., Taipei, Taiwan

[21] Appl. No.: 09/111,428

[22] Filed: Jul. 7, 1998

[30] Foreign Application Priority Data

Jun. 4, 1998 [TW] Taiwan ................................. 87108826

[51] Int. Cl.$^7$ .............................................. H01L 21/762
[52] U.S. Cl. ..................... 438/162; 438/407; 438/480; 438/528
[58] Field of Search .................... 438/407, 162, 438/219, 295, 480, 528, 234, 237, 238, FOR 222, 766, FOR 158

[56] References Cited

U.S. PATENT DOCUMENTS

| | | | |
|---|---|---|---|
| 4,819,052 | 4/1989 | Hutter | 357/49 |
| 4,948,742 | 8/1990 | Nishimura et al. | 437/24 |
| 4,960,726 | 10/1990 | Lechaton et al. | 437/59 |
| 5,196,355 | 3/1993 | Wittkower | 437/24 |
| 5,559,044 | 9/1996 | Williams et al. | 437/34 |
| 5,597,739 | 1/1997 | Sumi et al. | 437/21 |
| 5,602,046 | 2/1997 | Calafut et al. | 437/41 |
| 5,614,433 | 3/1997 | Mandelman | 437/57 |
| 5,661,043 | 8/1997 | Rissman et al. | 438/162 |
| 5,674,762 | 10/1997 | See et al. | 437/31 |
| 5,773,338 | 6/1998 | Shibib | 438/202 |

*Primary Examiner*—Geonge Fourson
*Attorney, Agent, or Firm*—Thomas, Kayden, Horstemeyer & Risley

[57] ABSTRACT

A method of fabricating layered integrated circuits on a silicon wafer utilizes the buried oxide insulating layer of a SOI structure for isolating junction devices such as diodes, well resistors, $N^{30}$ resistors, $P^{30}$ resistors, and bipolar junction transistors from MOS transistors. Consequently, junction devices are formed in the semiconductor substrate below the buried oxide insulation layer while the MOS transistors are formed in an epitaxial silicon layer above the buried oxide insulation layer. Furthermore, the MOS transistors located above the epitaxial silicon layer are isolated from each other by trench isolation structures. Since this invention provides a method of fabricating a layered integrated circuit structure whose devices can be stacked on top of each other in separate layers, the degree of integration for each unit area of wafer surface is increased.

20 Claims, 11 Drawing Sheets

METHOD OF FABRICATING LAYERED INTEGRATED CIRCUIT

CROSS-REFERENCE TO RELATED APPLICATION

This application claims the priority benefit of Taiwan application serial no. 87108826, filed Jun. 4, 1998, the full disclosure of which is incorporated herein by reference.

BACKGROUND OF THE INVENTION

1. Field of Invention

The present invention relates to a method of fabricating a semiconductor integrated circuit. More particularly, the present invention relates to a method of fabricating an integrated circuit having a layered structure.

2. Description of Related Art

In general, an integrated circuit (IC) that contains a large number of junction devices such as diodes, well resistors, $N^{30}$ resistors, bipolar junction transistors (BJTs) and so on needs lots of wafer area to accommodate these devices. Hence, the level of integration for these devices is greatly reduced.

Furthermore, when these junction devices integrate with metal-oxide-semiconductor (MOS) transistors in the same silicon wafer, serious latch-up problems and difficulties in precisely controlling the operating voltage may occur if the distance of isolation between the devices is insufficient.

In light of the foregoing, there is a need to provide an improved method of integrating junction devices with MOS transistors.

SUMMARY OF THE INVENTION

Accordingly, the present invention is to provide a method of fabricating layered integrated circuits capable of accommodating metal-oxide-semiconductor (MOS) transistors and various junction devices such as diodes, well resistors, $N^{30}$ resistor, bipolar junction transistors (BJTs). By arranging the junction devices and MOS transistors so that they reside upon different layers above a wafer, area occupied by these devices is decreased and hence the degree of integration for each unit of integrated circuit area on the wafer is increased.

In another aspect, this invention is to provide a method of fabricating layered integrated circuits in which the method uses a silicon-on-insulator (SOI) structure for isolating junction devices from MOS devices so that the problems caused by insufficient device isolation can be avoided.

To achieve these and other advantages and in accordance with the purpose of the invention, as embodied and broadly described herein, the invention provides a method of fabricating layered integrated circuits. The method comprises the steps of first providing a semiconductor substrate, and then forming a first oxide layer over the substrate. Thereafter, a silicon nitride layer is formed over the first oxide layer, and then a portion of the silicon nitride layer is etched away to form junction areas. Next, a junction implant and a junction drive-in are carried out, and then an oxidation operation is performed to form a plurality of junction devices in the semiconductor substrate. Subsequently, the silicon nitride layer and the first oxide layer are removed, and then a second oxide layer is formed over the substrate. Next, atomic oxygen is implanted into a region just underneath the surface of the semiconductor substrate. This is followed by an annealing and another oxidation operation to form a buried oxide insulation layer in the substrate. Thereafter, the second oxide layer is removed, and then an epitaxial silicon layer is grown above the buried oxide insulation layer. Next, a trench isolation layer is formed in the epitaxial silicon layer, and finally a plurality of MOS devices are formed above the epitaxial silicon layer.

According to one preferred embodiment of this invention, the method of forming the junction devices includes first performing a well implant to form a plurality of $P^{31}$ junctions. Next, N-type ions are selectively implanted, and then P-type ions are selectively implanted. Finally, the implanted ions are driven in to selectively form a plurality of $N^{30}$ junctions and a plurality of $P^{30}$ junctions in the $P^{31}$ junction.

According to one preferred embodiment of this invention, the method of forming the junction devices includes first performing a well implant to form a plurality of $N^{31}$ junctions. Next, N-type ions are selectively implanted, and then P-type ions are selectively implanted. Finally, the implanted ions are driven in to selectively form a plurality of $N^{30}$ junctions and a plurality of $P^{30}$ junctions in the $N^{31}$ junction.

According to one preferred embodiment of this invention, the method of forming the MOS devices includes first performing a selective N-well implant and a selective P-well implant to form respective N-wells and P-wells in the epitaxial silicon layer. Thereafter, a gate oxide layer and a gate conductive layer are formed above the epitaxial silicon layer, and then the gate oxide layer and the gate conductive layer are etched to form a gate structure. Next, a lightly doped drain implant is carried out for the purpose of selectively implanting P-type dopants into the N-well, and then another lightly doped drain implant is carried out for the purpose of selectively implanting N-type dopants into the P-well. Subsequently, spacers are formed on the sidewalls of the gate conductive layer above the epitaxial silicon layer. Finally, a heavy dose of P-type dopants are selectively implanted into the N-well, and then a heavy dose of N-type dopants are implanted into the P-well.

To achieve these and other advantages and in accordance with the purpose of the invention, as embodied and broadly described herein, the invention provides another method of fabricating layered integrated circuits. The method comprises the steps of first providing a semiconductor substrate, and then forming a first oxide layer over the substrate using an oxidation method. Thereafter, a silicon nitride layer is deposited over the first oxide layer, and then a portion of the silicon nitride layer is etched away to form a plurality of junction areas on the semiconductor substrate. Next, a junction implant and a junction drive-in are carried out, and then an oxidation operation is performed to form a plurality of different types of junction devices in designated junction areas. Subsequently, the silicon nitride layer and the first oxide layer are removed, and then oxidation is carried out to form a second oxide layer over the substrate. Next, atomic oxygen is implanted to a specified depth underneath the surface of the semiconductor substrate. This is followed by an annealing and another oxidation operation to form a buried oxide insulation layer at a specified depth below the top surface of the semiconductor substrate. Thereafter, the second oxide layer is removed, and then an epitaxial silicon layer is grown above the buried oxide insulation layer. Next, a plurality of isolation trenches is formed in the epitaxial silicon layer. Finally, a plurality of types of MOS devices are formed above the epitaxial silicon layer with each MOS device isolated from neighboring devices by the isolation trenches.

According to one preferred embodiment of this invention, the method of forming the junction devices includes first performing a well implant to form a plurality of $P^{31}$ junctions. Next, N-type ions are selectively implanted, and then P-type ions are selectively implanted. Finally, the implanted ions are driven in to form a plurality of $N^{30}$ junctions and a plurality of $P^{30}$ junctions in the $P^{31}$ junction selectively.

According to one preferred embodiment of this invention, the method of forming the junction devices includes first performing a well implant to form a plurality of $N^{31}$ junctions. Next, N-type ions are selectively implanted, and then P-type ions are selectively implanted. Finally, the implanted ions are driven in selectively forming a plurality of $N^{30}$ junctions and a plurality of $P^{30}$ junctions in the $N^{31}$ junction.

According to one preferred embodiment of this invention, the method of forming the MOS devices includes first performing a selective N-well implant and a selective P-well implant to form respective N-wells and P-wells in the epitaxial silicon layer. Thereafter, a gate oxide layer and a gate conductive layer are formed above the epitaxial silicon layer, and then the gate oxide layer and the gate conductive layer are patterned to form a gate structure. Next, a lightly doped drain implant is carried out for the purpose of selectively implanting P-type dopants into the N-well, and then another lightly doped drain implant is carried out for the purpose of selectively implanting N-type dopants into the P-well. Subsequently, spacers are formed on the sidewalls of the gate conductive layer above the epitaxial silicon layer. Finally, a heavy dose of P-type dopants is selectively implanted into the N-well, and then a heavy dose of N-type dopants is selectively implanted into the P-well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
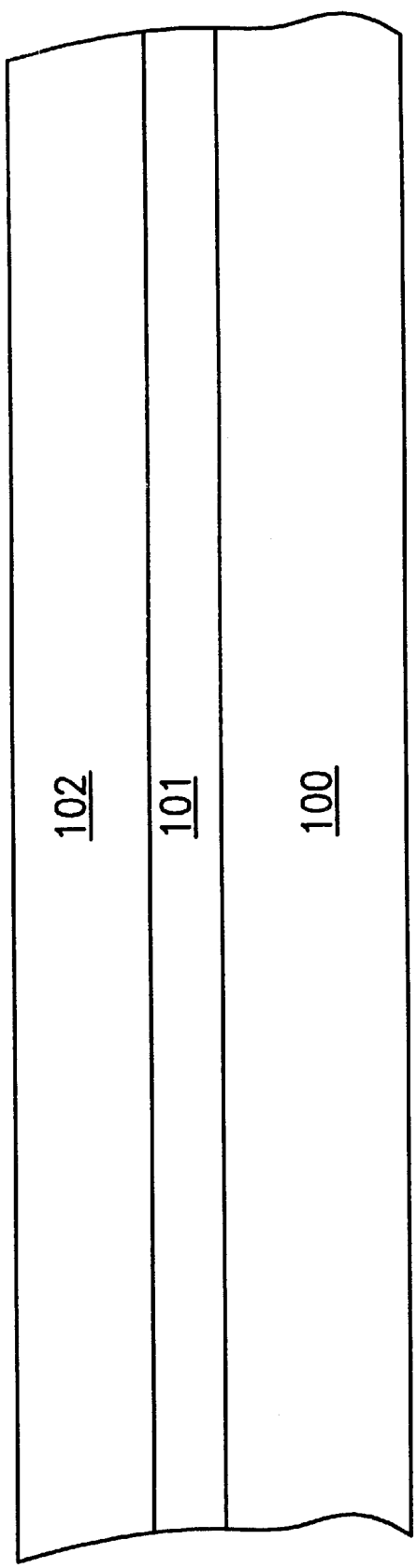
FIG. 1 is a cross-sectional view showing a conventional silicon-on-insulator structure.

Reference will now be made in detail to the present preferred embodiments of the invention, examples of which are illustrated in the accompanying drawings. Wherever possible, the same reference numbers are used in the drawings and the description to refer to the same or like parts.

This invention utilizes a silicon-on-insulator (SOI) structure together with trench isolation techniques for isolating junction devices and MOS devices. FIG. 1 is a cross-sectional view showing a conventional silicon-on-insulator structure. As shown in FIG. 1, a SOI structure comprises a semiconductor substrate 100, a buried oxide layer 101 and a silicon film 102. Since there is a silicon layer 102 above the insulating oxide layer 101, the result is called a silicon-on-insulator structure. The silicon film 102 can be an $N^{31}$ epitaxial layer or $P^{31}$ epitaxial layer, and the semiconductor substrate 100 can be an $N^{31}$ type substrate or a $P^{31}$ type substrate.

The method of fabricating a layered integrated circuit structure according to this invention includes using a buried oxide insulating layer of an SOI structure to isolate junction devices such as diodes, well resistors, $N^{30}$ resistors, and BJTs from MOS transistors. Consequently, the junction devices such as diodes, well resistors, $N^{30}$ resistors, and BJTs are formed in a layer located underneath the buried oxide insulating layer while the MOS transistors are formed in a layer above the buried oxide insulating layer. Both the junction device layer and the MOS transistor layer are stacked above a wafer.

Figure 2:
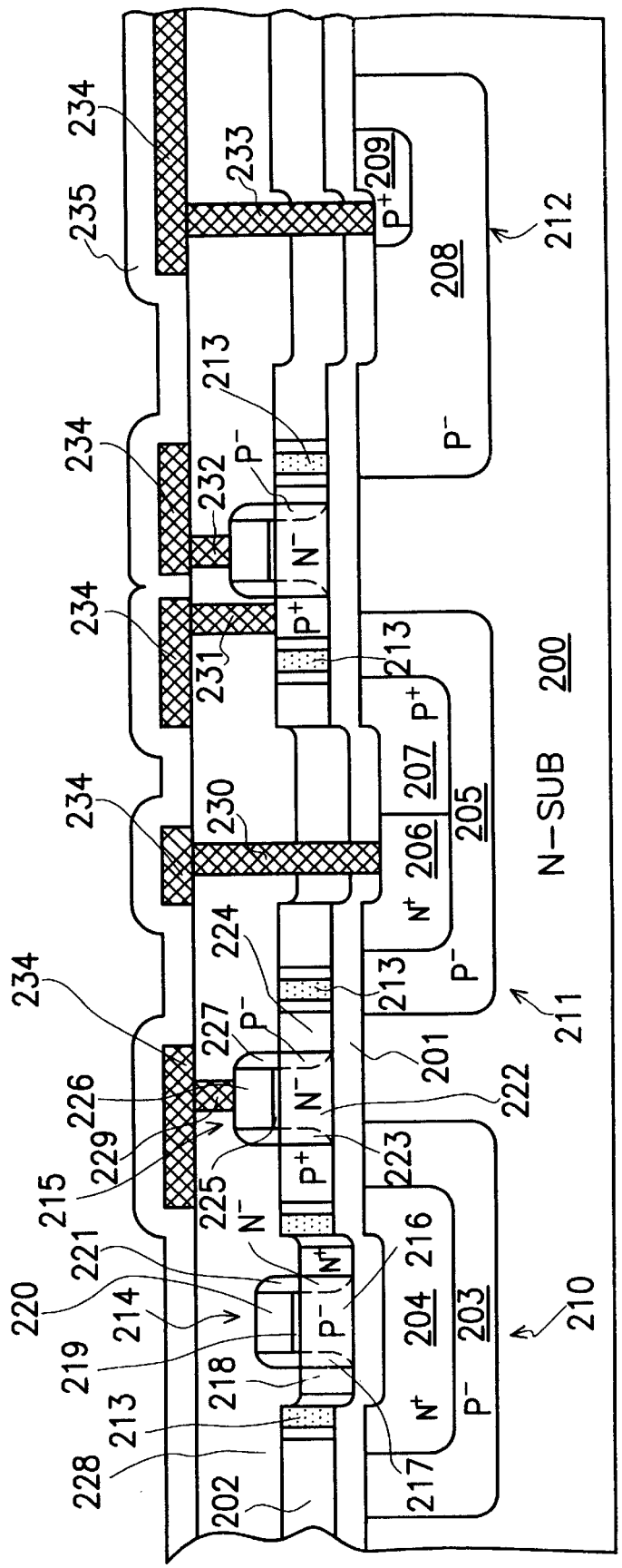
FIG. 2 is a cross-sectional view showing a layered integrated circuit structure fabricated according to one preferred embodiment of this invention.

FIG. 2 is a cross-sectional view showing a layered integrated circuit structure fabricated according to one preferred embodiment of this invention. As shown in FIG. 2, $P^{31}$, $N^-$, $P^{30}$, $N^{30}$ junctions are formed in a semiconductor substrate 200 located underneath the insulation oxide layer 201. The above junction structures can be combined in various ways to form junction devices such as diodes, resistors, and BJTs. For example, a $P^{31}$ junction 203 with an $N^{30}$ junction 204 forms an $N^{30}$ resistor 210. A $P^{31}$ junction 205, an $N^{30}$ junction 206 and a $P^{30}$ junction 207 together form a diode 211. Also, a $P^{31}$ junction 208 and a $P^{30}$ junction 209 form a $P^{31}$ well resistor 212. The $P^{31}$ junctions 203, 205 and 208 can be $P^{31}$ wells. The aforementioned junction device structures are used as an illustration only. Therefore, the scope of this invention should not be restricted to those structures. For example, the junction devices can also include a $P^{30}$ a resistor, one using an $N^{31}$ well in a diode, or an $N^{31}$ well resistor.

In FIG. 2, the MOS transistors are formed on an epitaxial silicon layer 202 above the insulation oxide layer 201. Trench isolation techniques are used to form trenches 213, which isolate neighboring MOS devices 214 and 215. The MOS device 214 is an NMOS transistor whose structure includes a $P^{31}$ channel region 216, an $N^{31}$ region 217, an $N^{30}$ source/drain region 218, a gate oxide layer 219 and a gate conductive layer 220. The MOS device 215 is a PMOS transistor whose structure includes an $N^{31}$ channel region 222, a $P^{31}$ region 223, a $P^{30}$ source/drain region 224, a gate oxide layer 225 and a gate conductive layer 226. Furthermore, the NMOS 214 further includes a spacer 221, and the PMOS 215 further includes a spacer 227.

In addition, an inter-layer dielectric (ILD) layer 228, contact plugs 229, 230, 231, 232, 233, a metallic layer 234 and a passivation layer 235 are formed above the MOS devices. Moreover, the contact plugs 229, 230, 231, 232, 233 are respectively connected to different voltage operating terminals of various devices so that the metallic layer 234 is similarly coupled to the various terminals of the devices.

In summary, as illustrated in FIG. 2, this invention provides a layered integrated circuit structure comprising a semiconductor substrate 200, a buried insulation layer 201, an epitaxial silicon layer 202, a plurality of junction devices 210, 211, 212, a plurality of MOS devices 214, 215 and a plurality of trenches 213. The buried insulation layer 201 above the semiconductor substrate 200 can be an oxide. The epitaxial silicon layer 202 above the buried insulation layer 201 can be a $P^{31}$ epitaxial layer or an $N^{31}$ epitaxial layer. The plurality of junction devices are formed in the semiconductor substrate 200 underneath the buried insulation layer 201, and can include a combination of $N^{30}$ resistors, $P^{30}$ resistors, $N^{31}$ well resistors, $P^{31}$ well resistors, and diodes or bipolar junction transistors. The plurality of MOS devices is formed in the epitaxial silicon layer 202 above the buried insulation layer 201, and can include an assembly of NMOS or PMOS transistors. The plurality of trenches 213 is used for isolating each MOS device from its neighboring MOS devices.

FIGS. 3A through 3I are cross-sectional views showing the progression of manufacturing steps in fabricating a layered integrated circuit structure according to one preferred embodiment of this invention.

Figure 3A:
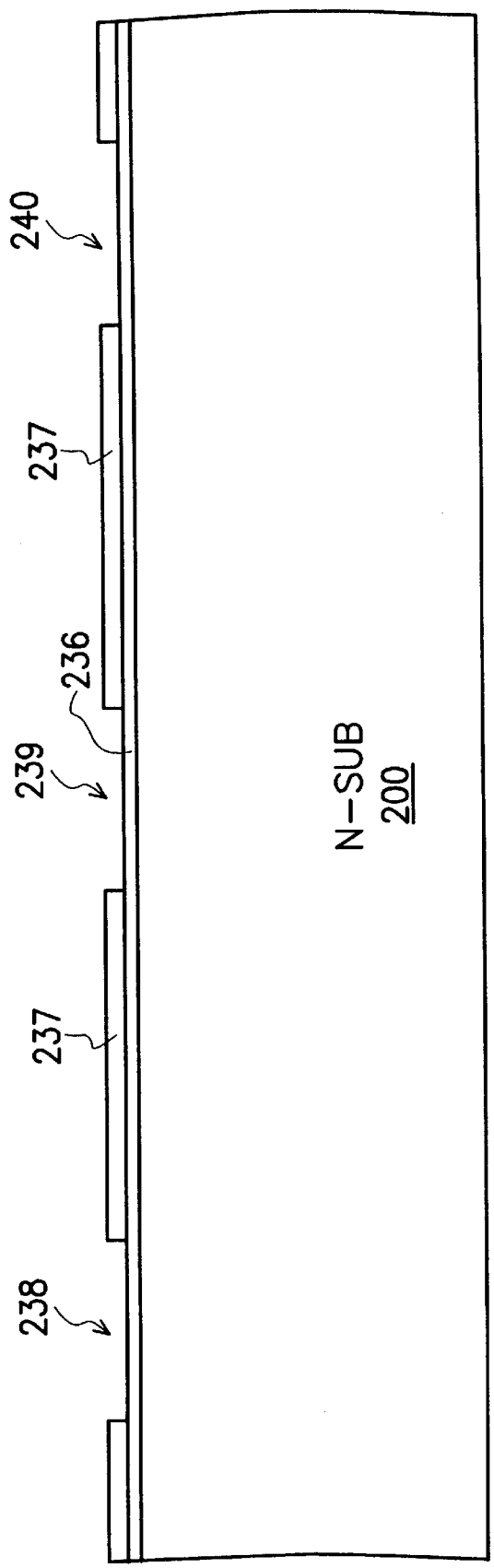
FIGS. 3A through 3I are cross-sectional views showing the progression of manufacturing steps in fabricating a layered integrated circuit structure according to one preferred embodiment of this invention.

First, as shown in FIG. 3A, a semiconductor substrate 200 is provided, and then a first oxide layer 236 and a silicon nitride layer 237 are sequentially formed over the substrate 200. Thereafter, a portion of the silicon nitride layer 237 is etched away to form junction areas 238, 239 and 240.

Figure 3B:
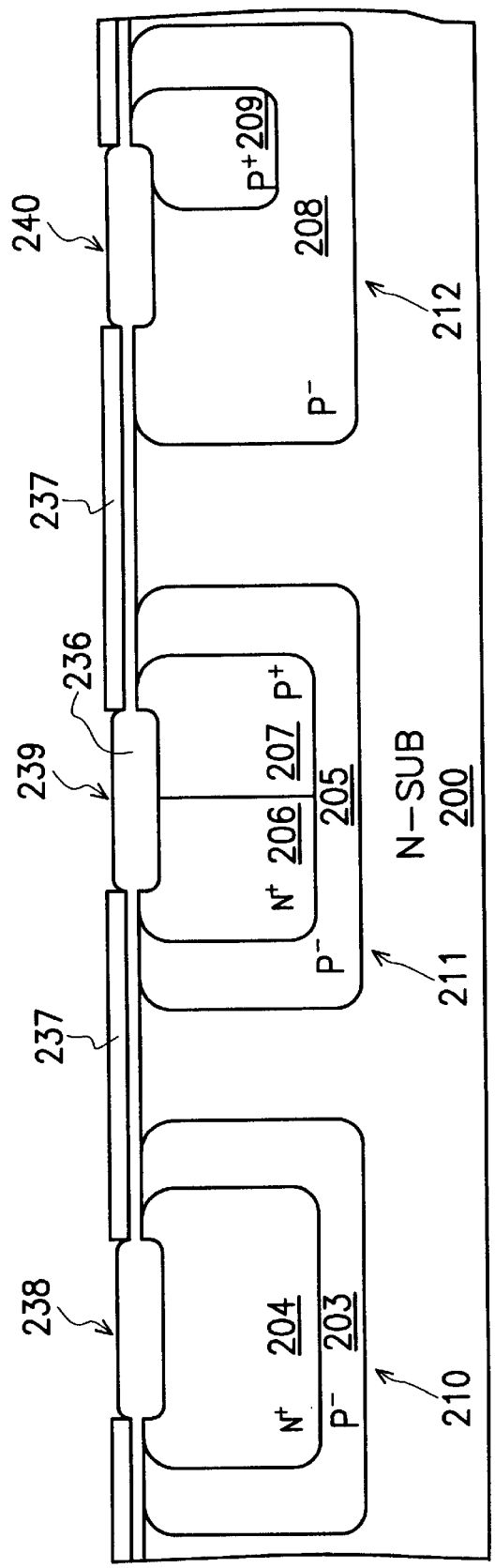

Next, as shown in FIG. 3B, a junction implant and a junction drive-in are performed and followed by an oxidation, in which processes are formed a plurality of junction devices 210, 211, 212 within the semiconductor substrate 200. The $N^{30}$ resistor 210 is constructed from a $P^{31}$ junction 203 and an $N^{30}$ junction 204, and furthermore the $N^{30}$ junction 204 is located within the $P^{31}$ junction 203 region. The diode 211 is constructed from a $P^{31}$ junction 205, an $N^{30}$ junction 206 and a $P^{30}$ junction 207, and furthermore the $N^{30}$ junction 206 and the $P^{30}$ junction 207 are joined together and located within the $P^{31}$ junction 205 region. The $P^{31}$ well resistor 212 is constructed from a $P^{31}$ junction 208 and a $P^{30}$ junction 209, and furthermore the $P^{30}$ junction 209 is located within the $P^{31}$ junction 208 region.

The method of forming the aforementioned junction devices includes first performing a well implant to form a plurality of $P^{31}$ junctions 203, 205 and 208. Next, a selective N-type ion implant and a selective P-type ion implant are separately carried out. Finally, an ion drive-in operation is conducted to selectively form a plurality of $N^{30}$ junctions 204, 206 and a plurality of $P^{30}$ junctions 207, 209 within the $P^{31}$ junction regions 203, 205 and 208. For example, $P^{31}$ junction 203 and $N^{30}$ junction 204 are formed in junction region 238; $P^{31}$ junction 205 and $N^{30}$ junction 206 and $P^{30}$ junction 207 are formed in junction region 239; and $P^{31}$ junction 208 and $P^{30}$ junction 209 are formed in junction region 240.

The above junction device structures 210, 211, and 212 are only examples of junction devices, and therefore should not be taken as the only structures in this invention. For example, the junction devices can further include $P^{30}$ resistors, diodes having $N^{31}$ wells, $N^{31}$ well resistors and so on. In other words, the $P^{30}$ resistor can be a device constructed from an $N^{31}$ junction and a $P^{30}$ junction, and furthermore the $P^{30}$ junction is located within the $N^{31}$ junction region. The diode can be a device constructed from an $N^{31}$ junction, an $N^{30}$ junction and a $P^{30}$ junction, and furthermore the $N^{30}$ junction and the $P^{30}$ junction are joined together both within the $N^{31}$ junction region. The $N^{31}$ well resistor can be a device constructed from an $N^{31}$ junction and an $N^{30}$ junction, and furthermore the $N^{30}$ junction is located within the $N^{31}$ junction region.

Figure 3C:
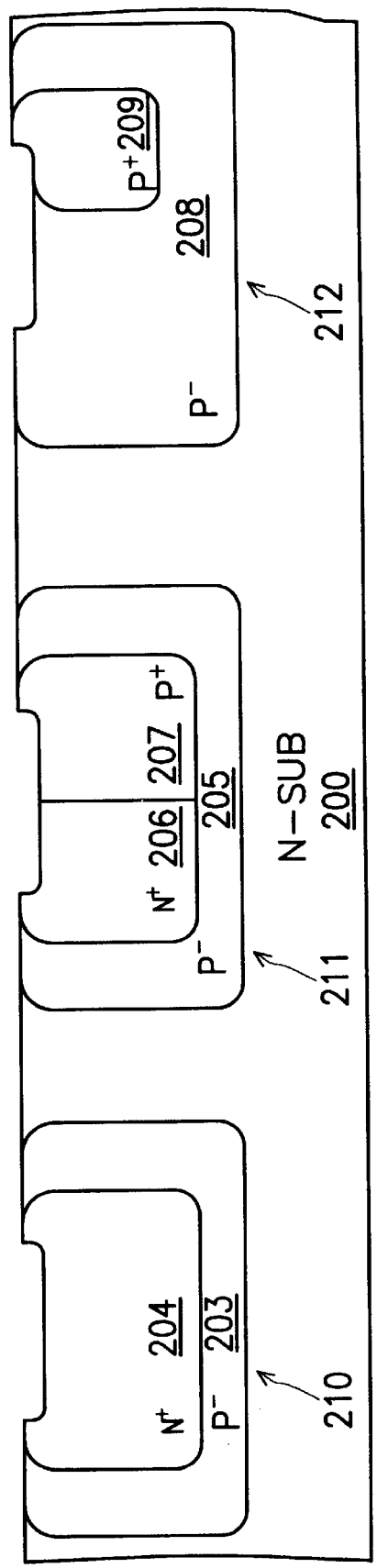

Next, as shown in FIG. 3C, the silicon nitride layer 237 and the first oxide layer 236 above the semiconductor substrate 200 are removed.

Figure 3D:
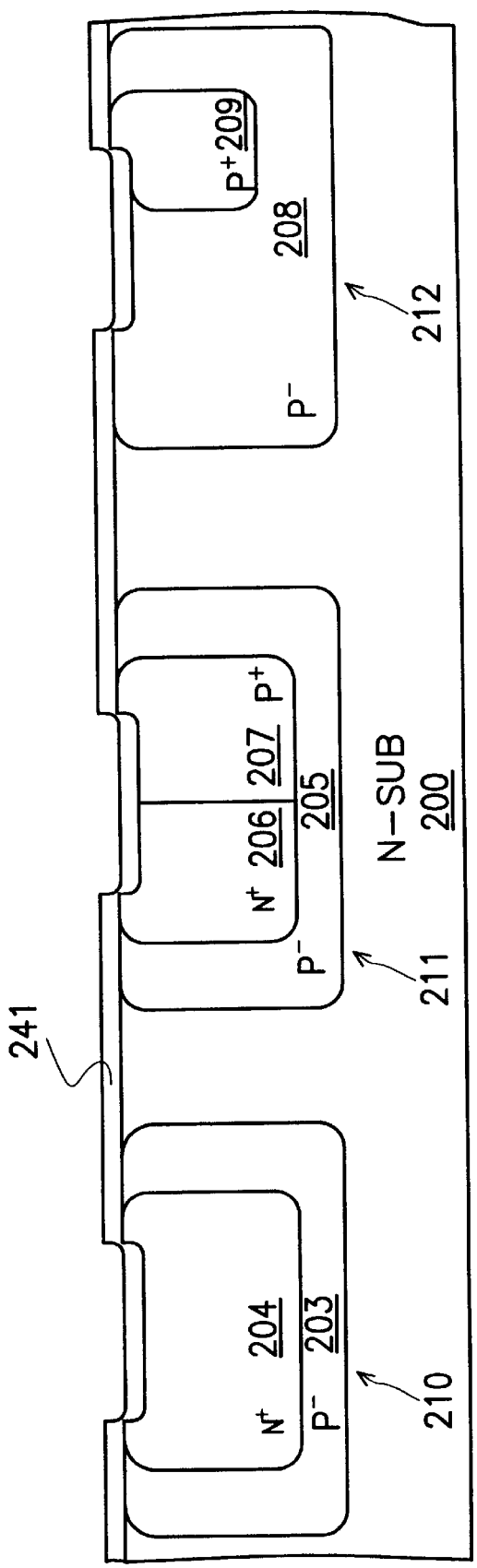

Thereafter, as shown in FIG. 3D, a second oxide layer 241 is formed over the substrate 200.

Figure 3E:
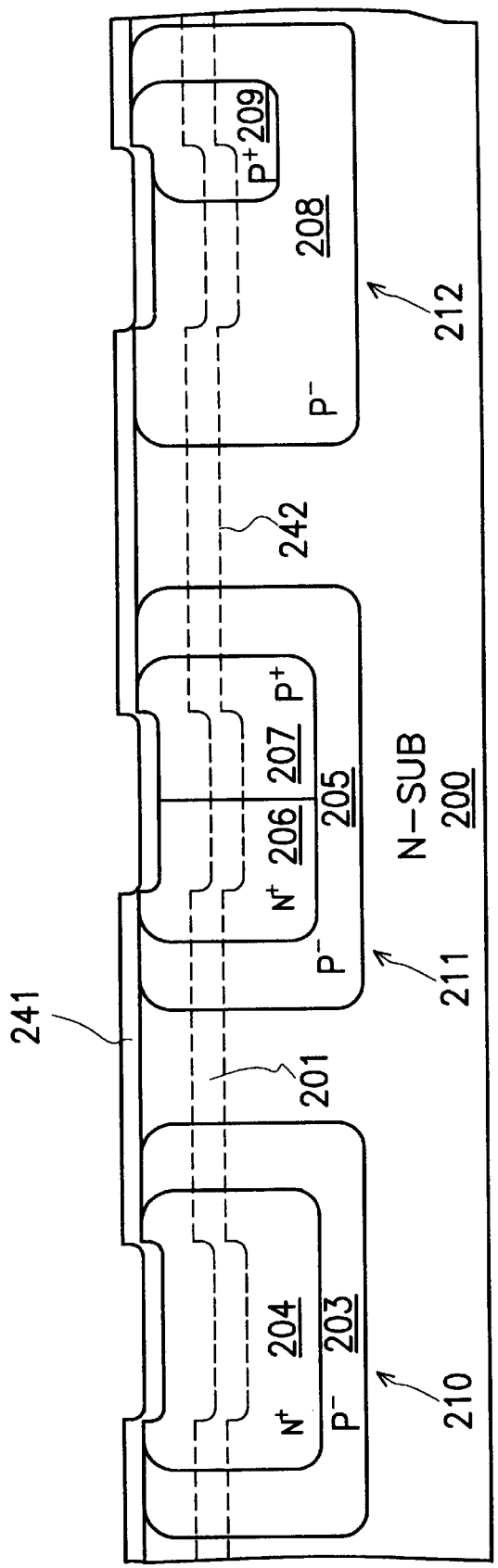

Subsequently, as shown in FIG. 3E, atomic oxygen is implanted into the semiconductor substrate 200 down to a specified depth 242 below the top surface.

Figure 3F:
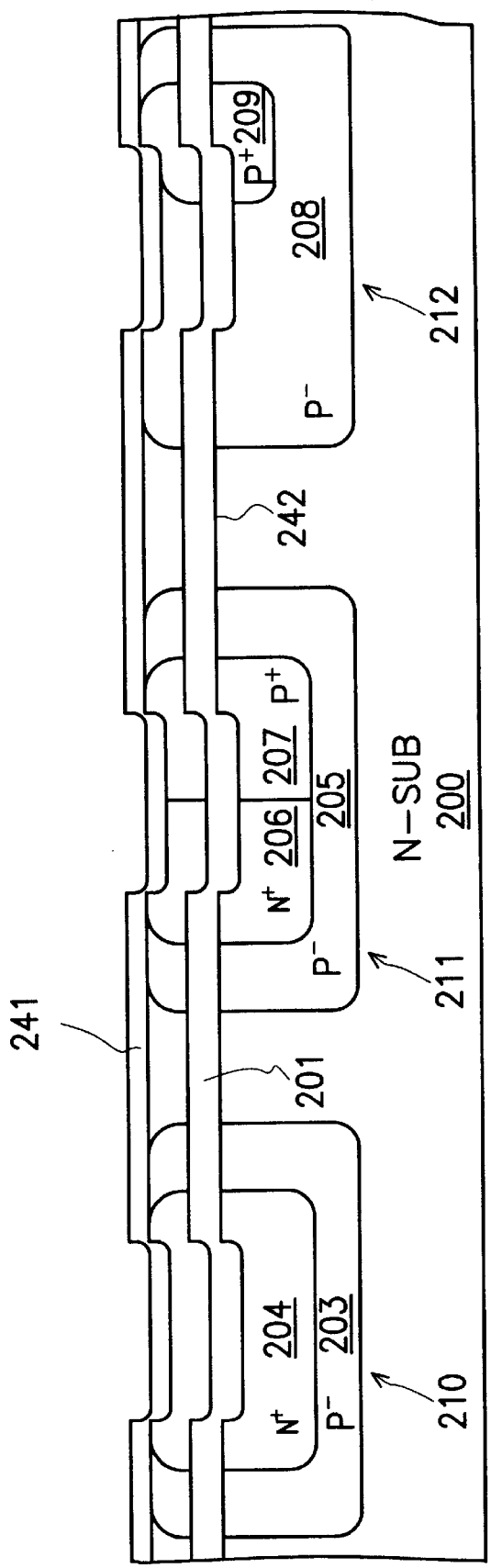

Next, as shown in FIG. 3F, an annealing and oxidation operation is carried out to form a buried oxide insulation layer 201 at the specified depth 242 below the top surface of the semiconductor substrate 200.

Figure 3G:
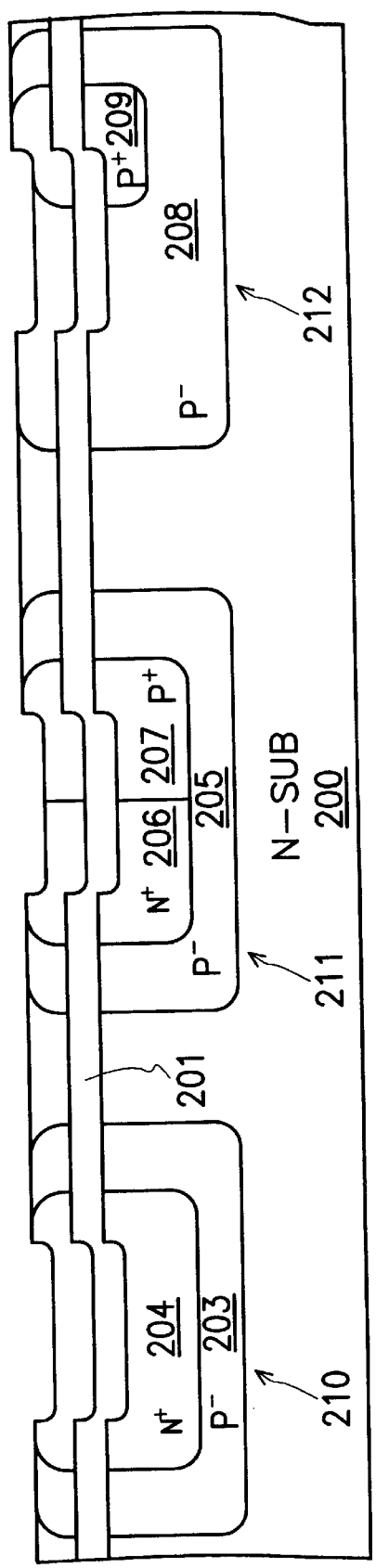

Next, as shown in FIG. 3G, the second oxide layer 241 above the semiconductor substrate 200 is removed.

Figure 3H:
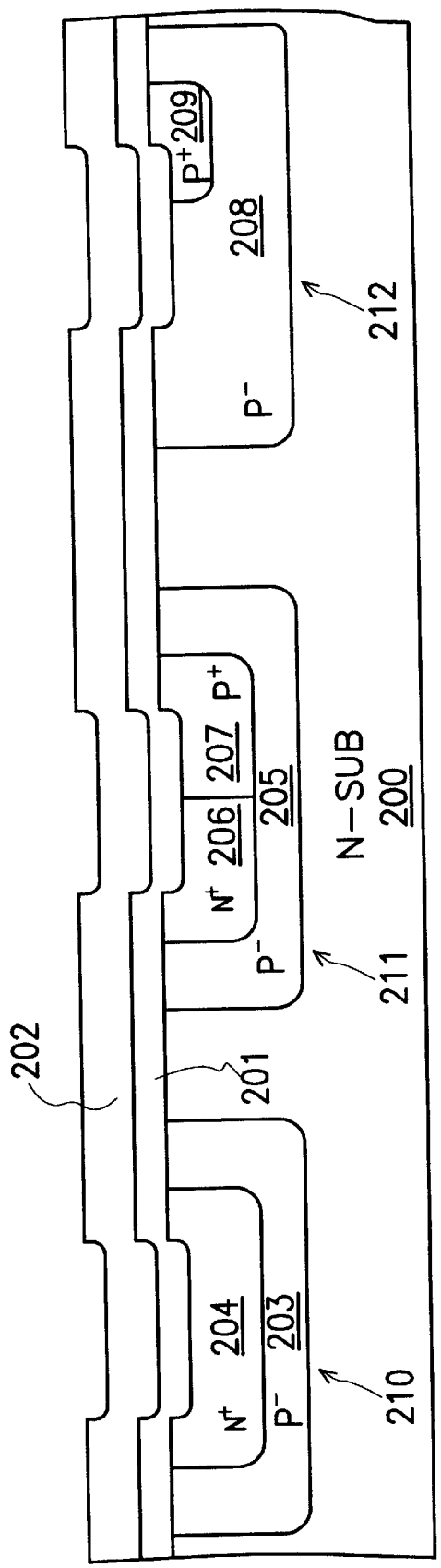

Next, as shown in FIG. 3H, an epitaxial silicon layer 202 is grown above the buried oxide insulation layer 201.

Figure 3I:
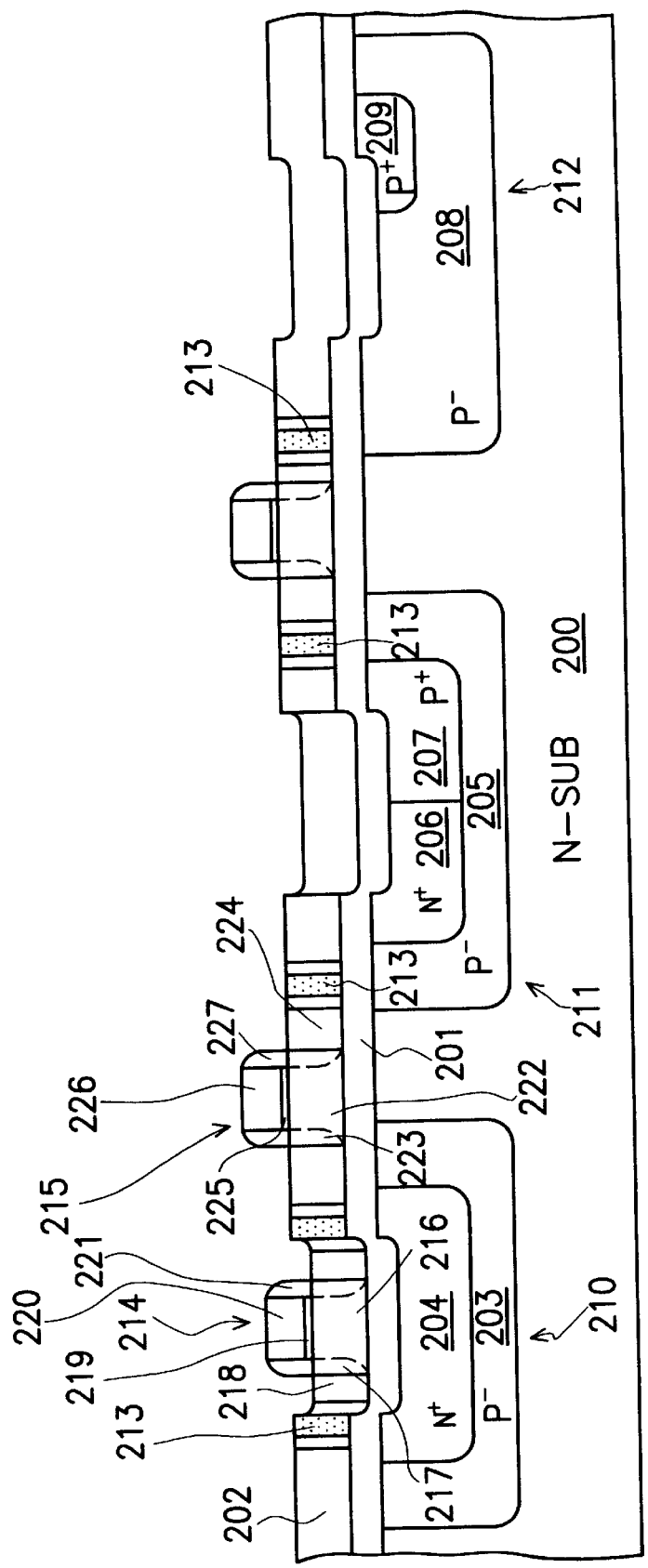

Thereafter, as shown in FIG. 3I, a trench isolation layer 213 is formed in the epitaxial silicon layer 202. Then, a plurality of types of MOS devices 214 and 215 are formed above the epitaxial silicon layer 202. The method of fabricating the MOS devices includes performing a selective N-well implant and a selective P-well implant with respect to the epitaxial silicon layer 202, which forms an N-well 222 and a P-well 216 in the epitaxial silicon layer 202. Next, a gate oxide layer 225 (219) and a gate conductive layer 226 (220) are formed over the epitaxial silicon layer 202, and then the gate oxide layer 225 (219) and the gate conductive layer 226 (220) are patterned. Thereafter, a lightly doped drain implant is conducted to selectively implant P-type dopants into the N-well 222 and implant N-type dopants into the P-well 216. Subsequently, spacers 227 (221) are formed above the epitaxial layer 202 and on the sidewalls of the gate conductive layer 226 (220). Finally, a heavy implant is conducted to selectively implant P-type dopants into the N-well 222 to form a $P^{31}$ region 223 and $P^{30}$ source/drain region 224, and selectively implanting N-type dopants into the P-well 216 to form $N^{31}$ region 217 and $N^{30}$ source/drain region 218. Consequently, PMOS device 215 and NMOS device 214 are formed above the epitaxial silicon layer 202.

The above embodiment of this invention provides a method of forming layered integrated circuits. The method relies on the isolation of junction devices, such as diodes, well resistors, $N^{30}$ resistors, $P^{30}$ resistors, bipolar junction transistors, from MOS transistors through the buried oxide insulating layer of a SOI structure. Hence, the diodes, the well resistors, the $N^{30}$ resistors, the $P^{30}$ resistors, the bipolar junction transistors and so on are formed in the semiconductor substrate below the buried oxide insulation layer while the MOS transistors are formed in the epitaxial silicon layer above the buried oxide insulation layer. Furthermore, the MOS transistors above the epitaxial silicon layer are isolated from each other by trench isolation structures. In summary, this invention provides a method of fabricating a layered integrated circuit structure whose devices can be stacked one above the other in layers. Hence, the degree of integration for each unit area of wafer surface is increased. In other words, the SOI structure together with the trench isolation structure is capable of packing more devices into a given area and forming a better device isolation than a conventional fabricating method. Therefore, leakage current and circuit latch-up can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a layered integrated circuit, the method comprising:

providing a semiconductor substrate;

forming a first oxide layer over the substrate;

forming a silicon nitride layer over the first oxide layer;

removing a portion of the silicon nitride layer to form a junction area;

forming a plurality of junction devices in the semiconductor substrate;

removing the silicon nitride layer and the first oxide layer;

forming a second oxide layer over the semiconductor substrate;

implanting oxygen into a region below the semiconductor substrate surface;

performing thermal oxidation operation to form a buried oxide insulation layer below the substrate surface, wherein the junction area is underneath the buried oxide insulation layer;

removing the second oxide layer;

growing an epitaxial silicon layer over the buried oxide insulation layer;

forming a plurality of trench isolation structures in the epitaxial silicon layer; and forming a plurality of metal-oxide-semiconductor (MOS) devices above the epitaxial silicon layer.

2. The method of claim 1, wherein the step of forming the junction devices includes the substeps of:

performing a well implant to form a plurality of $P^{31}$ junctions;

performing a selective N-type ion implant;

performing a selective P-type ion implant; and performing an ion drive-in operation to form selectively a plurality of $N^{30}$ junctions and a plurality of $P^{30}$ junctions within the $P^{31}$ junction.

3. The method of claim 2, wherein the $P^{31}$ junction, the $N^{30}$ junction and the $P^{30}$ junction together form a diode structure, and furthermore the $N^{30}$ junction and the $P^{30}$ junction are joined together and enclosed within the $P^{31}$ junction region.

4. The method of claim 2, wherein the $P^{31}$ junction and the $N^{30}$ junction together form an $N^{30}$ resistor structure, and the $N^{30}$ junction is furthermore enclosed within the $P^{31}$ junction region.

5. The method of claim 2, wherein the $P^{31}$ junction and the $P^{30}$ junction together form a $P^{31}$ well resistor structure, and the $P^{30}$ junction is furthermore enclosed within the $P^{31}$ junction.

6. The method of claim 1, wherein the step of forming the junction devices includes the substeps of:

performing a well implant to form a plurality of $N^{31}$ junctions;

performing a selective N-type ion implant;

performing a selective P-type ion implant; and performing an ion drive-in operation to form selectively a plurality of $N^{30}$ junctions and a plurality of $P^{30}$ junctions in the $N^{31}$ junctions.

7. The method of claim 6, wherein the $N^{31}$ junction, the $P^{30}$ junction and the $N^{30}$ junction together form a diode structure, and the $P^{30}$ junction and the $N^{30}$ junction are furthermore joined together and enclosed within the $N^{31}$ junction region.

8. The method of claim 6, wherein the $N^{31}$ junction and the $P^{30}$ junction together form a $P^{30}$ resistor structure, and the $P^{30}$ junction is furthermore enclosed within the $N^{31}$ junction region.

9. The method of claim 6, wherein the $N^{31}$ junction and the $N^{30}$ junction together form an $N^{31}$ well resistor structure, and the $N^{30}$ junction is furthermore enclosed within the $N^{31}$ junction.

10. The method of claim 1, wherein the step of forming the MOS devices includes the substeps of:

performing separate selective N-well and P-well implants to form an N-well and a P-well in the epitaxial silicon layer;

forming a gate oxide layer and a gate conductive layer above the epitaxial silicon layer, and then patterning the gate oxide layer and the gate conductive layer;

performing separate lightly doped drain implants, selectively implanting P-type dopants into the N-well and implanting N-type dopants into the P-well;

forming spacers above the epitaxial silicon layer and on the sidewalls of the gate conductive layer; and performing separate heavy implants to implant selectively P-type dopants into the N-well and N-type dopants into the P-well.

11. A method of a fabricating layered integrated circuit, the method comprising:

providing a semiconductor substrate;

conducting a first oxidation to form a first oxide layer over the semiconductor substrate;

depositing a silicon nitride layer over the first oxide layer;

etching away a portion of the silicon nitride layer to form a junction area;

performing a junction implant, a junction drive-in and an oxidation to form a plurality of types of junction devices in the semiconductor substrate;

removing the silicon nitride layer and the first oxide layer;

conducting a second oxidation to form a second oxide layer over the semiconductor substrate;

performing an atomic oxygen implant to implant oxygen into a region below the semiconductor substrate surface;

performing an annealing and oxidation operation to form a buried oxide insulation layer below the semiconductor substrate surface, wherein the plurality of types of junction devices are underneath the buried oxide insulation layer;

removing the second oxide layer;

growing an epitaxial silicon layer over the buried oxide insulation layer;

forming a plurality of trench isolation structures in the epitaxial silicon layer; and forming a plurality of metal-oxide-semiconductor (MOS) devices above the epitaxial silicon layer.

12. The method of claim 11, wherein the step of forming the junction devices includes the substeps of:

performing a well implant to form a plurality of $P^{31}$ junctions;

performing separate, selective N-type ion and P-type ion implants; and performing an ion drive-in operation to form selectively a plurality of $N^{30}$ junctions and a plurality of $P^{30}$ junctions within the $P^{31}$ junction.

13. The method of claim 12, wherein the $P^{31}$ junction, the $N^{30}$ junction and the $P^{30}$ junction together form a diode structure, and the $N^{30}$ junction and the $P^{30}$ junction are furthermore joined together and enclosed within the $P^{31}$ junction region.

14. The method of claim 12, wherein the $P^{31}$ junction and the $N^{30}$ junction together form an $N^{30}$ resistor structure, and the $N^{30}$ junction is furthermore enclosed within the $P^{31}$ junction region.

15. The method of claim 12, wherein the $P^{31}$ junction and the $P^{30}$ junction together form a $P^{31}$ well resistor structure, and the $P^{30}$ junction is furthermore enclosed within the $P^{31}$ junction.

16. The method of claim 11, wherein the step of forming the junction devices includes the substeps of:
   performing a well implant to form a plurality of $N^{31}$ junctions;
   performing separate selective N-type ion and P-type ion implants; and
   performing an ion drive-in operation to form selectively a plurality of $N^{30}$ junctions and a plurality of $P^{30}$ junctions in the $N^{31}$ junctions.

17. The method of claim 16, wherein the $N^{31}$ junction, the $P^{30}$ junction and the $N^{30}$ junction together form a diode structure, and the $P^{30}$ junction and the $N^{30}$ junction are furthermore joined together and enclosed within the $N^{31}$ junction region.

18. The method of claim 16, wherein the $N^{31}$ junction and the $P^{30}$ junction together forms a $P^{30}$ resistor structure, and the $P^{30}$ junction is furthermore enclosed within the $N^{31}$ junction region.

19. The method of claim 16, wherein the $N^{31}$ junction and the $N^{30}$ junction together form an $N^{31}$ well resistor structure, and the $N^{30}$ junction is furthermore enclosed within the $N^{31}$ junction.

20. The method of claim 11, wherein the step of forming the MOS devices includes the substeps of:
   performing separate selective N-well and P-well implants to form an N-well and a P-well in the epitaxial silicon layer;
   forming a gate oxide layer and a gate conductive layer above the epitaxial silicon layer, and then patterning the gate oxide layer and the gate conductive layer;
   performing separate lightly doped drain implants, selectively implanting P-type dopants into the N-well and implanting N-type dopants into the P-well;
   forming spacers above the epitaxial silicon layer and on the sidewalls of the gate conductive layer; and
   performing separate heavy implants, selectively implanting P-type dopants into the N-well and N-type dopants into the P-well.

* * * * *